US012716934B2

(12) United States Patent
Min et al.

(10) Patent No.: US 12,716,934 B2
(45) Date of Patent: Aug. 25, 2026

(54) ELECTROLUMINESCENCE INSPECTION APPARATUS WITH ELASTIC CORES

(71) Applicant: SAMSUNG ELECTRONICS CO., LTD., Suwon-si (KR)

(72) Inventors: Sungyong Min, Suwon-si (KR); Changkyu Chung, Suwon-si (KR); Kyungwoon Jang, Suwon-si (KR); Daeseok Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 135 days.

(21) Appl. No.: 18/602,717

(22) Filed: Mar. 12, 2024

(65) Prior Publication Data

US 2024/0255563 A1 Aug. 1, 2024

Related U.S. Application Data

(63) Continuation of application No. PCT/KR2022/013516, filed on Sep. 8, 2022.

(30) Foreign Application Priority Data

Nov. 2, 2021 (KR) ........................ 10-2021-0148987
Dec. 20, 2021 (KR) ........................ 10-2021-0182782

(51) Int. Cl.
*G01R 31/26* (2020.01)

(52) U.S. Cl.
CPC ................................ *G01R 31/2635* (2013.01)

(58) Field of Classification Search
CPC .... G01R 31/2635; G01R 31/26; G01R 31/28; G01R 31/2844; G01R 31/2863;
(Continued)

(56) References Cited

U.S. PATENT DOCUMENTS 7,679,381 B2 * 3/2010 Ma ..................... G01R 31/2635
324/754.07
11,251,222 B2 * 2/2022 Kwag ..................... G01J 3/506
(Continued)

FOREIGN PATENT DOCUMENTS

CN 112394272 B 5/2021
JP 2000-147007 A 5/2000
(Continued)

OTHER PUBLICATIONS

International Search Report (PCT/ISA/210) issued by the International Searching Authority on Dec. 21, 2022 in corresponding International Application No. PCT/KR2022/013516.
(Continued)

*Primary Examiner* — Vingh P Nguyen
(74) *Attorney, Agent, or Firm* — Sughrue Mion, PLLC

(57) ABSTRACT

An electroluminescence inspection apparatus includes a first substrate, and electrode members arranged at a first surface of the first substrate, and electrically contacted respectively with a chip electrode pad of light emitting diodes arranged at a second substrate based on performing an electroluminescence inspection, wherein an electrode member includes contact protrusions configured to be elastically contacted at a chip electrode member of the light emitting diode based on the first substrate is pressed by the second substrate.

20 Claims, 12 Drawing Sheets

(58) Field of Classification Search
CPC ............ G01R 31/2879; G01R 31/3842; G01R 1/06716; G01R 1/067; G01R 1/06794; G01R 1/04; G06T 2207/30148; G06T 7/0004
See application file for complete search history.

(56) References Cited

U.S. PATENT DOCUMENTS

| | | | | |
|---|---|---|---|---|
| 2016/0043279 | A1* | 2/2016 | Jean | H10H 20/816 977/950 |
| 2017/0365569 | A1 | 12/2017 | Kriebel | |
| 2018/0174931 | A1* | 6/2018 | Henley | G01R 31/312 |
| 2020/0243712 | A1* | 7/2020 | Fukaya | H10H 20/01 |
| 2021/0026188 | A1* | 1/2021 | Ohno | H05B 33/10 |
| 2023/0290919 | A1 | 9/2023 | Chung et al. | |

FOREIGN PATENT DOCUMENTS

| | | | |
|---|---|---|---|
| JP | 3120796 | B2 | 12/2000 |
| JP | 2019-78685 | A | 5/2019 |
| KR | 10-2002-0066791 | A | 8/2002 |
| KR | 10-0754086 | B1 | 8/2007 |
| KR | 10-1369496 | B1 | 3/2014 |
| KR | 10-2019-0106655 | A | 9/2019 |
| KR | 10-2020-0006263 | A | 1/2020 |
| KR | 10-2020-0012743 | A | 2/2020 |
| KR | 10-2020-0079481 | A | 7/2020 |
| KR | 10-2021-0077126 | A | 6/2021 |
| KR | 10-2286322 | B1 | 8/2021 |
| WO | 2022/114395 | A1 | 6/2022 |

OTHER PUBLICATIONS

Written Opinion (PCT/ISA/237) issued by the International Searching Authority on Dec. 21, 2022 in corresponding International Application No. PCT/KR2022/013516.
Office Action issued Jun. 18, 2025 by the Korean Patent Office for KR Patent Application No. 10-2021-0182782.
Office Action issued Feb. 19, 2026 by the Korean Ministry of Intellectual Property for KR Patent Application No. 10-2021-0182782.

* cited by examiner

ELECTROLUMINESCENCE INSPECTION APPARATUS WITH ELASTIC CORES

CROSS-REFERENCE TO RELATED APPLICATION(S)

This application is a by-pass continuation application of International Application No. PCT/KR2022/013516, filed on Sep. 8, 2022, which is based on and claims priority to Korean patent Application nos. 10-2021-0148987, filed on Nov. 2, 2021 and 10-2021-0182782, filed on Dec. 20, 2021, in the Korean Intellectual Property Office, the disclosures of which are incorporated by reference herein in their entireties.

BACKGROUND

1. Field

The disclosure relates to an electroluminescence inspection apparatus which inspects electroluminescence properties of ultra-small light emitting diodes.

2. Description of Related Art

In the related art, to inspect properties (performance deviations according to brightness and color of each light emitting diode (LED) chip) LED chips, light emitted from an LED is measured, and after luminance information and wavelength information are obtained, a corresponding bin is determined. In this case, a performance deviation is measured by separating by LEDs by one each. However, the chips may not be measured separately by one each like LEDs because of micro light emitting diodes (micro LEDs) which are much smaller in size compared to LEDs (e.g., about a size of less than or equal to 100 μm). Accordingly, for micro LEDs, a method of indirectly identifying the micro LED properties through a photoluminescence (PL) inspection rather than an electroluminescence (EL) inspection has been used.

The PL inspection uses a phenomenon of inducing luminance by irradiating light at a plurality of micro LEDs. The above analyzes the phenomenon of energy of incident light exciting particles, a portion of the absorbed energy escaping through other pathways, and light being emitted by a gap which is left thereafter. However, data obtained through the PL inspection may be numerical values of tendency and relativity. Accordingly, an absolute value and the like may not be obtained through the PL inspection. In addition, the PL inspection has a problem of being able to inspect only properties of a luminance layer of the micro LEDs, and not being able to detect malfunctions at a chip electrode pad portion of the micro LED.

Meanwhile, the EL inspection may be a method by which a plurality of probe pins provided at a probe substrate are inspected by physically contacting chip electrode pads of the plurality of micro LEDs and thereby, simultaneously measure the electrical properties and the optical properties of the micro LEDs.

However, the ultra-small micro LED having a size of less than or equal to 100 μm may be such that an interval of a pair of chip electrode pads is about several μ to 20 μm. A probe substrate of the related art may be deteriorated in productivity due to manufacturing difficulty being high, because manufacturing the probe pins densely to respectively contact the chip electrode pads of the micro LEDs having fine intervals is difficult. In addition, because the probe pins require periodic replacements due to the probe pins being very fine and prone to being bent, manufacturing and maintenance costs may increase. In addition, if the probe pins are bent, the probe pins are not correctly contacted at the chip electrode pad of the micro LED and a misdetection may occur deteriorating the reliability of the inspection.

SUMMARY

Provided is an electroluminescence inspection apparatus which can separately discern electrical properties of ultra-small light emitting diodes by lowering manufacturing difficulty and minimizing misdetection through a structure.

An electroluminescence inspection apparatus may include a first substrate; and a plurality of electrode members arranged at a first surface of the first substrate, and electrically contacted respectively with a chip electrode pad of a plurality of light emitting diodes arranged at a second substrate based on performing an electroluminescence inspection, wherein an electrode member of the plurality of electrode members may include a plurality of contact protrusions configured to be elastically contacted at a chip electrode member of a light emitting diode of the plurality of light emitting diodes based on the first substrate being pressed by the second substrate.

The electrode member may include a plurality of elastic cores protruded at the first surface of the first substrate with an interval therebetween; and a conductive pad including a first portion covering the first surface of the first substrate and a second portion covering the plurality of elastic cores.

The plurality of elastic cores may be formed of a polymer having elasticity.

The conductive pad may be formed of a metal having conductivity.

A first portion of the conductive pad may be electrically connected with a first wiring formed at the first surface of the first substrate.

A first portion of the conductive pad may be electrically connected with a via formed at the first substrate.

The plurality of contact protrusions may have a same shape.

The plurality of contact protrusions may be configured such that: a first plurality of the plurality of contact protrusions have a first shape; and a second plurality of the plurality of contact protrusions have a second shape that is different from the first shape of the first plurality of the plurality of contact protrusions.

The plurality of contact protrusions may be formed in a circular form.

The plurality of contact protrusions may be configured such that a cross-section of a contact protrusion of the plurality of contact protrusions is in a dome shape.

The plurality of contact protrusions may be formed in an elliptical form.

The plurality of contact protrusions may be formed in a linear form.

The plurality of contact protrusions may be arranged in parallel along a length direction of the electrode member with an interval therebetween.

The plurality of contact protrusions may form an inclined hatch pattern with respect to a length direction of the electrode member.

The electroluminescence inspection apparatus according to one or more embodiments may further include a driving circuit configured to apply current to the plurality of light emitting diodes through the plurality of electrode members; a detector configured to detect light emitted from the plurality of light emitting diodes; and a controller configured to determine separate electrical properties of the plurality of light emitting diodes and a defect in a portion of the chip electrode pad of the plurality of light emitting diodes based on light detected from the detector.

In addition, an electroluminescence inspection apparatus may include a first substrate; a first electrode member arranged at a first surface of the first substrate configured to electrically contact a first chip electrode pad of a light emitting diode of a second substrate, and a second electrode member disposed at the first surface of the first substrate adjacent to the first electrode member configured to electrically contact a second chip electrode pad of the light emitting diode of the second substrate, wherein the first electrode member and the second electrode member are provided with a plurality of contact protrusions configured to elastically change by the first chip electrode pad and the second chip electrode pad based on pressing the first substrate to the second substrate, and wherein the plurality of contact protrusions are configured to restore to a prior form by elastic force based on separating the second substrate from the first substrate.

A contact protrusion of the plurality of contact protrusions may include: a plurality of elastic cores protruded at the first surface of the first substrate with an interval therebetween; and a conductive pad covering the plurality of elastic cores.

The plurality of elastic cores may be formed of a polymer having elasticity, and the conductive pad may be formed of a metal having conductivity.

The plurality of contact protrusions may be formed in at least one of a circular form, an elliptical form, or a linear form.

The plurality of contact protrusions may be arranged at intervals between 2 and 20 μm, inclusive.

BRIEF DESCRIPTION OF THE DRAWINGS

The above and other aspects, features, and advantages of certain embodiments of the present disclosure are more apparent from the following description taken in conjunction with the accompanying drawings, wherein.

DETAILED DESCRIPTION

Figure 1:
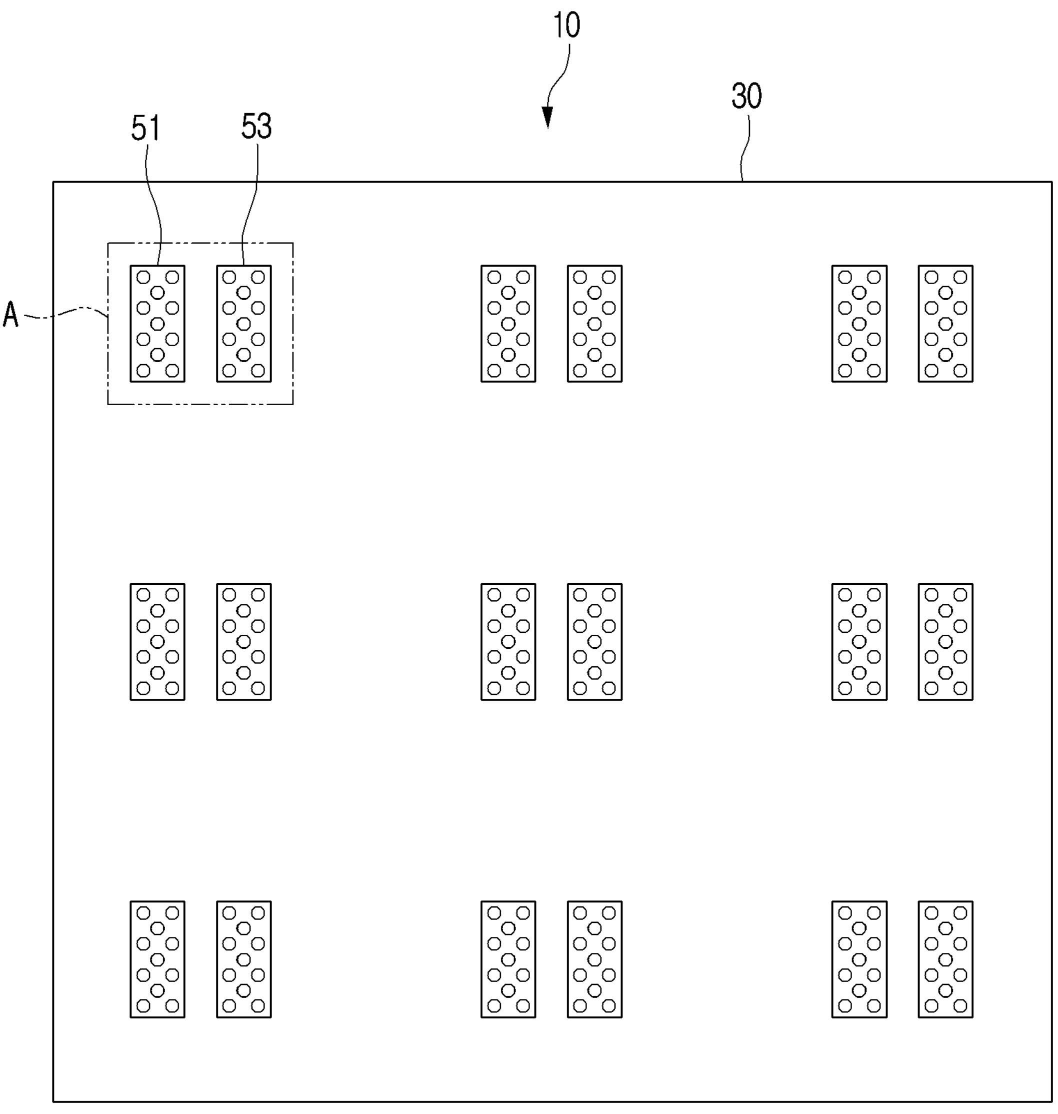
FIG. 1 is a plane view illustrating an electroluminescence inspection apparatus according to one or more embodiments.

Various embodiments will be described in greater detail below with reference to the accompanied drawings. Embodiments described herein may be variously modified. A specific embodiment may be illustrated in the drawings and described in detail in the detailed description. However, the specific embodiment described in the accompanied drawing is only to assist in the easy comprehension of the various embodiments. Accordingly, it should be noted that the embodiments of the disclosure are not limited in technical spirit by the specific embodiments described in the accompanied drawings, and should be interpreted to include all modifications, combinations, equivalents and/or alternatives of the embodiments included in the spirit of the disclosure and in the technical scope.

In the disclosure, terms including ordinal numbers such as first and second may be used in describing the various elements, but the elements are not limited by the above-described terms. The above-described terms may be used only for the purpose of distinguishing one element from another element.

In the disclosure, it is to be understood that the terms such as “have” or “include” are used herein to designate a presence of a characteristic, number, step, operation, element, component, or a combination thereof, and not to preclude a presence or a possibility of adding one or more of other characteristics, numbers, steps, operations, elements, components or a combination thereof. When a certain element is indicated as being “coupled with/to” or “connected to” another element, it may be understood as the certain element being directly coupled with/to the another element or as being coupled through other element. On the other hand, based on a certain element is indicated as “directly coupled with/to” or “directly connected to” another element, it may be understood as the other element not being present between the certain element and the another element.

In the disclosure, the expression ‘same’ may refer to not only fully matching, but also include a difference of an extent that considers a processing error range.

In addition thereto, in describing the disclosure, in case it is determined that the detailed description of related known technologies may unnecessarily confuse the gist of the disclosure, the detailed description thereof will be abbreviated or omitted.

An electroluminescence inspection apparatus according to one or more embodiments will be described below with reference to the drawings.

Figure 2:
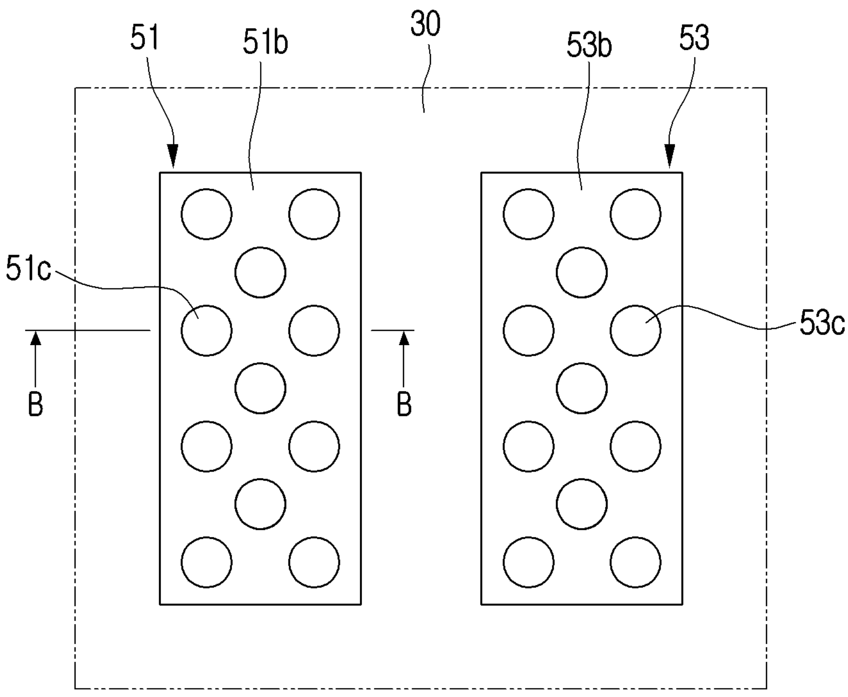
FIG. 2 is an enlarged view of an electrode member having a plurality of contact protrusions illustrating part A shown in FIG. 1 according to one or more embodiments.
Figure 3:
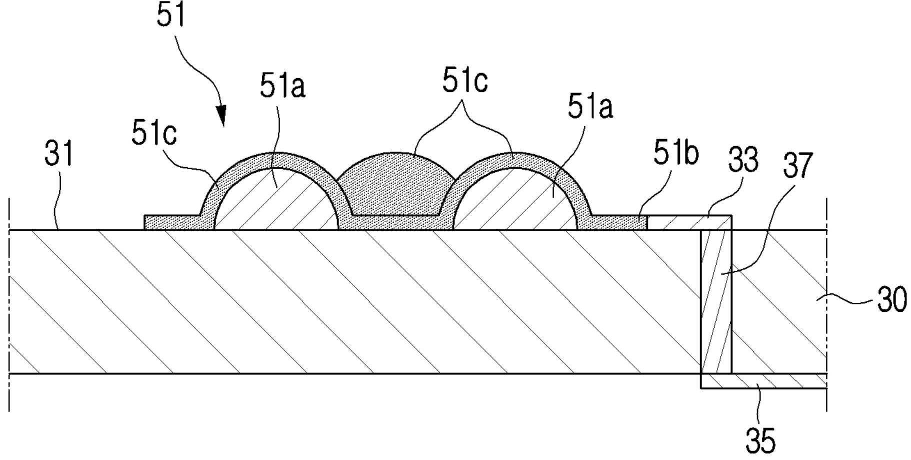
FIG. 3 is a cross-sectional view of an electrode member illustrating along line B-B shown in FIG. 2 according to one or more embodiments.

FIG. 1 is a plane view illustrating a probe substrate of an electroluminescence inspection apparatus according to one or more embodiments, FIG. 2 is an enlarged view of an electrode member having a plurality of circular protrusions illustrating part A shown in FIG. 1, and FIG. 3 is a cross-sectional view of an electrode member illustrating along line B-B shown in FIG. 2.

Referring to FIG. 1, an electroluminescence inspection apparatus 10 according to one or more embodiments may include a probe substrate 30, and a plurality of first and second electrode members 51 and 53 disposed with a predetermined interval therebetween at the probe substrate 30.

The probe substrate 30 may have a plurality of electrode members 51 and 53 disposed in pairs with an interval therebetween.

The probe substrate 30 may be disposed with a connector which is electrically connectable to a driving circuit 80 (FIG. 10) for the EL inspection at a rear surface thereof. If the probe substrate 30 is a glass substrate, the connector may be mounted at a flexible printed circuit board (FPCB) disposed at the rear surface of the probe substrate 30 in a film on glass (FOG) method.

The probe substrate 30 may include a plurality of first wirings 33 to which one end of the probe substrate 30 is electrically connected with each of the electrode members 51 and 53 at a front surface thereof, and a plurality of second wirings 35 to which one end of the probe substrate 30 is electrically connected to the FPCB at the rear surface thereof.

The opposite end of the first wiring and the opposite end of the second wiring may be electrically connected 1:1 respectively by a plurality of vias 37 formed penetrating through the probe substrate 30.

Alternatively, the opposite end of the first wiring and the opposite end of the second wiring may be electrically connected 1:1 respectively by a plurality of side wirings formed at an edge of the probe substrate 30.

Alternatively, the probe substrate 30 may include the plurality of second wirings 35 at the rear surface thereof omitting the plurality of first wirings 33. In this case, each of the electrode members 51 and 53 may have a portion thereof electrically connected to one end of a corresponding via, and an opposite end of each via and the opposite end of the second wiring electrically connected 1:1 respectively.

The probe substrate 30 may be formed with the glass substrate, but is not limited thereto. For example, the probe substrate 30 may be formed with a synthetic resin based (e.g., polyimide (PI), polyethylene terephthalate (PET), polyethersulfone (PES), polyethylene naphthalate (PEN), polycarbonate (PC), for example) substrate or a ceramic substrate.

Figure 9:
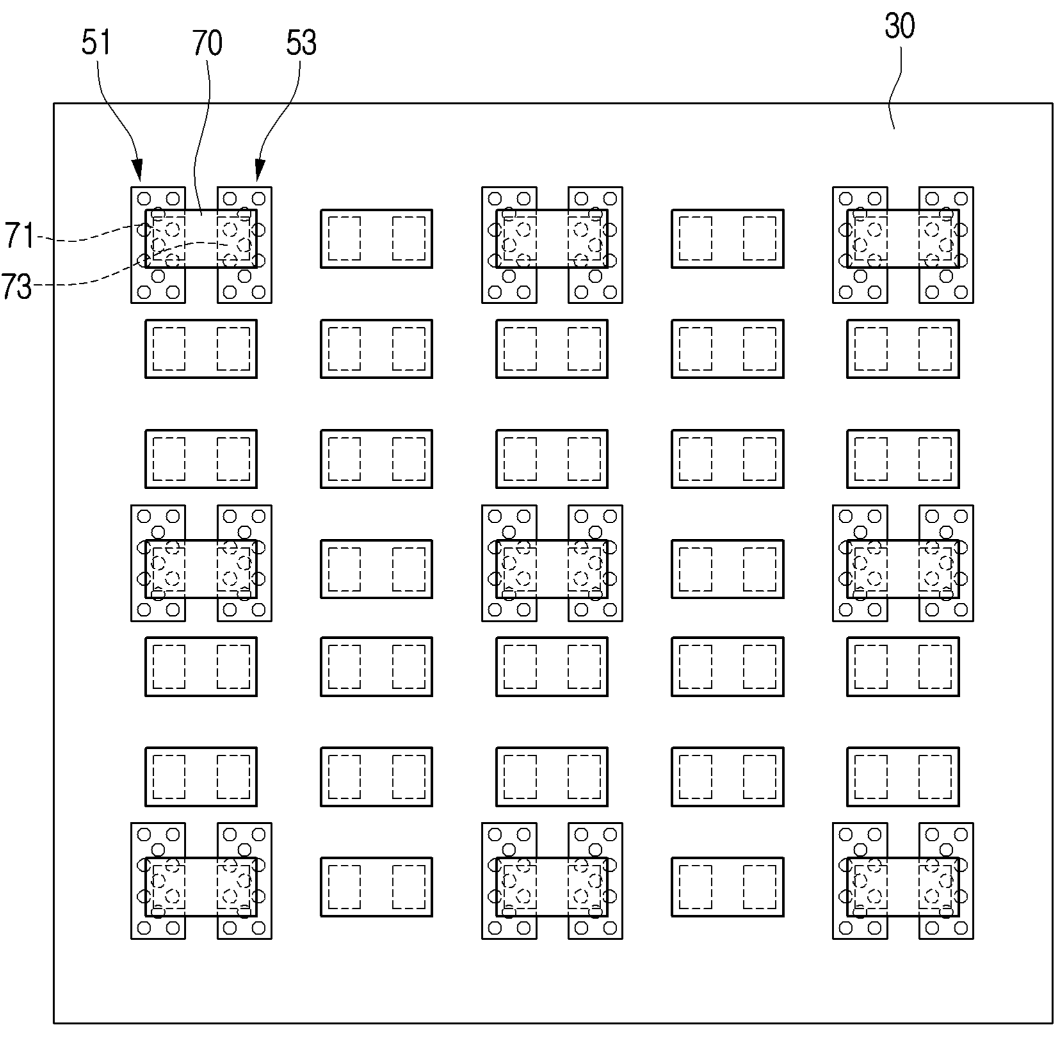
FIG. 9 is a diagram illustrating an example in which light emitting diodes of a relay substrate are electrically contacted with an electrode member arranged in an electroluminescence inspection apparatus according to one or more embodiments.

Referring to FIG. 2 and FIG. 3, a first electrode member 51 and a second electrode member 53 may be disposed with an interval of an extent both may respectively connect to a first chip electrode pad 71 and a second chip electrode pad 73 provided at one light emitting diode 70 (referring to FIG. 9).

The first electrode member 51 and the second electrode member 53 may be formed in a substantially same configuration. Accordingly, only the configuration of the first electrode member 51 will be described below and descriptions of the second electrode member 53 will be omitted.

The first electrode member 51 may be include a plurality of first elastic cores 51*a* formed at a front surface 31 of the probe substrate 30, and a first conductive pad 51*b* covering the plurality of first elastic cores 51*a*.

The plurality of first elastic cores 51*a* may be formed on the front surface 31 of the probe substrate 30, or formed on an organic film if the organic film is formed at the front surface 31 of the probe substrate 30. The plurality of first elastic cores 51*a* may be formed densely such that an interval between the first elastic cores 51*a* which are adjacent to one another is less than or equal to about several μm.

The plurality of first elastic cores 51*a* may be formed in a circular form when viewed from a plane and a cross-section thereof may be formed in a rough dome shape.

The plurality of first elastic cores 51*a* may be formed of a non-conductive or a conductive material. For example, the plurality of first elastic cores 51*a* may be formed of an elastic polymer such as polyimide, a metal having elasticity, or a metal having both elasticity and conductivity.

The first conductive pad 51*b* may be formed of a metal (e.g., an alloy of any one from among Al, Ti, Cr, Ni, Pd, Ag, Ge, and Au or at least two therefrom).

The first conductive pad 51*b* may be formed into a greater area than an area at which the plurality of first elastic cores 51*a* are arranged. The first conductive pad 51*b* may have one portion thereof in close contact with the front surface 31 of the probe substrate 30. Based on another portion of the first conductive pad 51*b* being formed along an outer circumferential surface of the plurality of first elastic cores 51*a*, a plurality of first contact protrusions 51*c* may be formed.

Because the plurality of first contact protrusions 51*c* are formed along the outer circumferential surface of the plurality of first elastic cores 51*a*, the plurality of first contact protrusions 51*c* may have a shape corresponding to a shape of each first elastic core 51*a* and have an arrangement pattern corresponding to an arrangement pattern of the plurality of first elastic cores 51*a*. In this case, the plurality of first contact protrusions 51*c* may be formed densely such that the interval between the first contact protrusions 51*c* adjacent to one another is less than or equal to about several μm.

The plurality of first contact protrusions 51*c* may be arranged in a pattern as in FIG. 2. Alternatively, the plurality of first contact protrusions 51*c* may be arranged randomly within a pattern.

The first electrode member 51 may further include a capping layer covering the first conductive pad 51*b* to prevent the first conductive pad 51*b* from being oxidized. The capping layer may be formed of an oxide (e.g., indium tin oxide (ITO) or indium zinc oxide (IZO)). Alternatively, the capping layer may be formed of a metal having conductivity (e.g., Au) to prevent oxidation of the first conductive pad 51*b* and to have a good electrical contact with the first chip electrode pad 71.

The first electrode member 51 configured as described above may be changed in shape due to at least a portion from among the plurality of first elastic cores 51*a* being pressed by pressure which presses a substrate subject to inspection 60 toward the electroluminescence inspection apparatus 10 during the electroluminescence inspection. In this case, an elastic force may be applied to the plurality of first elastic cores 51*a* in a direction opposite to a pressing direction. Accordingly, a whole of the plurality of first contact protrusions 51*c* or a portion of the plurality of first contact protrusions 51*c* may be in close contact with the first chip electrode pad 71. Accordingly, a stable electrical connection between the first electrode member 51 and the first chip electrode pad 71 may be made based on performing the electroluminescence inspection.

In addition, the plurality of first elastic cores 51*a* may be densely distributed with an interval therebetween in an area of one first conductive pad 51*b*. Accordingly, even if a misalignment occurs between the substrate subject to inspection 60 and the electroluminescence inspection apparatus 10 at the electroluminescence inspection, the first chip electrode pad 71 may be contacted with at least one of the plurality of first contact protrusions 51*c*. Accordingly, because non-contact between the first chip electrode pad 71 and the first electrode member 51 may be prevented based on performing the electroluminescence inspection, reliability of inspection may be improved.

The second electrode member 53 may be disposed at one side of the first electrode member 51 with a predetermined interval therebetween. The second electrode member 53 may be formed substantially same as the configuration of the first electrode member 51.

For example, the second electrode member 53 may include a plurality of second elastic cores formed at the front surface 31 of the probe substrate 30, and a second conductive pad 53*b* covering the plurality of second elastic cores. The plurality of second elastic cores may be formed in a circular form if viewed from a plane and a cross-section thereof may be formed in a rough dome shape. The second conductive pad 53*b* may be formed into a greater area than an area at which the plurality of second elastic cores are arranged. The second conductive pad 53*b* may have one portion thereof in close contact with the front surface 31 of the probe substrate 30. Based on another portion of the second conductive pad 53*b* being formed along an outer circumferential surface of the plurality of second elastic cores, a plurality of second contact protrusions 53*c* may be formed.

Referring to FIG. 2, the plurality of second contact protrusions 53*c* of the second electrode member 53 may be arranged in a same pattern as the plurality of first contact protrusions 51*c* of first electrode member 51.

The plurality of first contact protrusions 51*c* of the first electrode member 51 and the plurality of second contact protrusions 53*c* of the second electrode member 53 may be formed into various shapes without the shape being limited to the dome shape.

Figure 4:
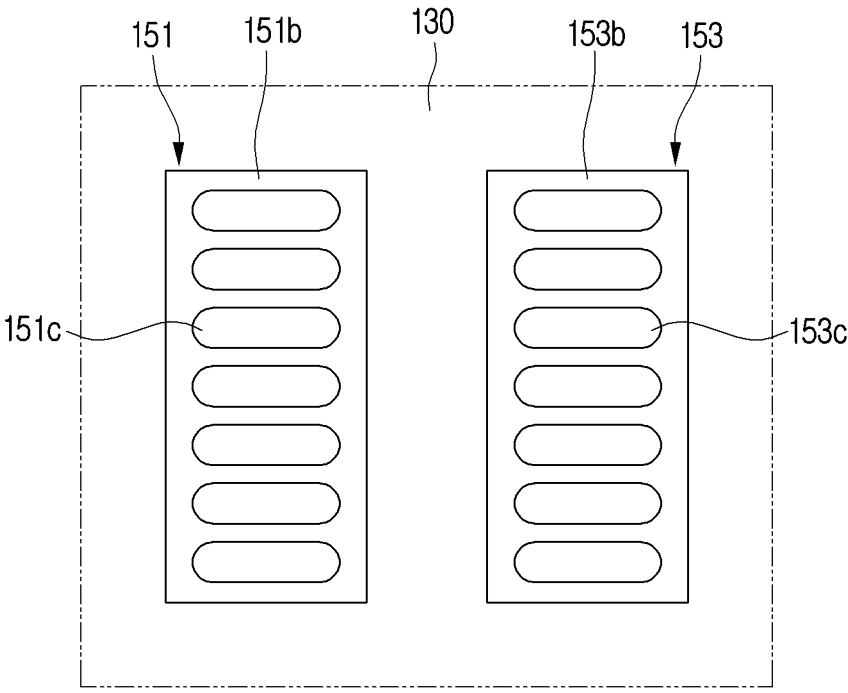
FIG. 4 is an enlarged view illustrating an example of a plurality of contact protrusions formed in a linear form according to one or more embodiments.

FIG. 4 is an enlarged view illustrating an example of a plurality of contact protrusions formed in a linear form.

Referring to FIG. 4, a first electrode member 151 disposed at a probe substrate 130 may include a plurality of elastic cores having a predetermined length and one first conductive pad 151*b* covering the plurality of elastic cores.

In this case, the plurality of elastic cores may be respectively in a linear form and arranged in parallel with an interval therebetween along a length direction of the first conductive pad 151*b*. Accordingly, a plurality of first contact protrusions 151*c* provided at the first electrode member 151 may be formed in a same shape and pattern as the plurality of elastic cores. For example, the plurality of first contact protrusions 151*c* may be respectively in the linear form and arranged in parallel with the interval therebetween along the length direction of the first conductive pad 151*b*.

Although the plurality of first contact protrusions 151*c* are arranged at intervals as in FIG. 4, the above is not limited thereto, and may be arranged at irregular intervals. In addition, the plurality of first contact protrusions 151*c* may be arranged in different lengths from one another without being arranged in a same length.

A second electrode member 153 disposed at the probe substrate 130 may be formed substantially the same as the configuration of the first electrode member 151. For example, the second electrode member 153 may include a plurality of elastic cores in linear form, one second conductive pad 153*b* covering the plurality of elastic cores, and a plurality of second contact protrusions 153*c*.

Figure 5:
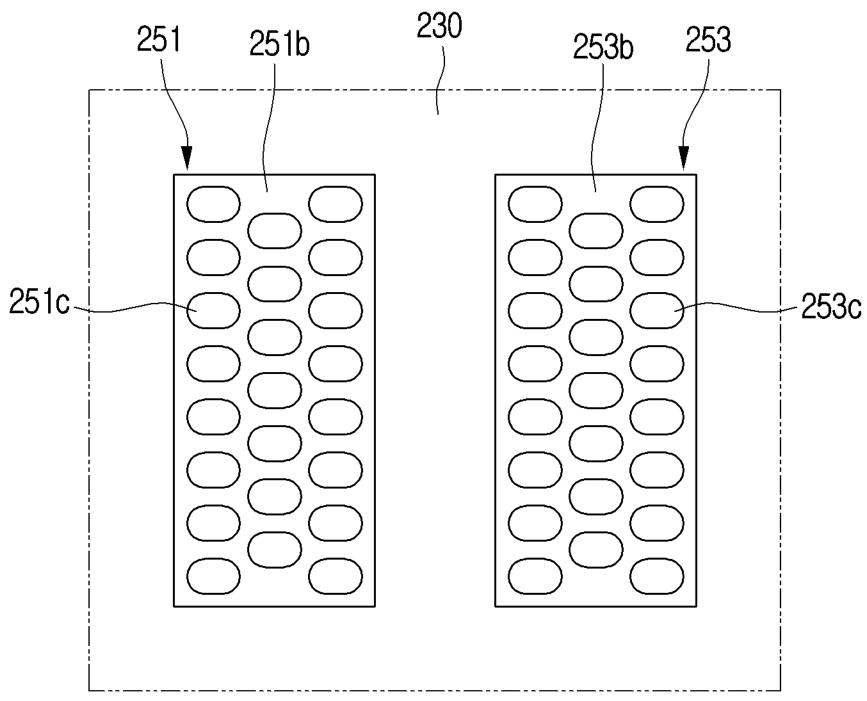
FIG. 5 is an enlarged view illustrating an example of a plurality of contact protrusions formed in an elliptical form according to one or more embodiments.

FIG. 5 is an enlarged view illustrating an example of a plurality of contact protrusions formed in an elliptical form.

Referring to FIG. 5, a first electrode member 251 disposed at a probe substrate 230 may include a plurality of elastic cores and one first conductive pad 251*b* covering the plurality of elastic cores.

In this case, the plurality of elastic cores may appear in a rough elliptical form on a plane respectively, and the cross-sections thereof may be protruded from the probe substrate 230 and formed such that an upper surface is in a shape having a predetermined curvature. Accordingly, a plurality of first contact protrusions 251*c* provided at the first electrode member 251 may form the same shape as the plurality of elastic cores. For example, the plurality of first contact protrusions 251*c* may appear in a rough elliptical form on a plane respectively, and the cross-sections thereof may be protruded from the probe substrate 230 and formed such that an upper surface is in a shape having a predetermined curvature.

The plurality of first contact protrusions 151*c* may be arranged at intervals as in FIG. 5, but is not limited thereto, and may be arranged irregularly.

A second electrode member 253 disposed at the probe substrate 230 may be formed substantially the same as the configuration of the first electrode member 251. For example, the second electrode member 253 may include a plurality of elastic cores in a rough elliptical form, one second conductive pad 253*b* covering the plurality of elastic cores, and a plurality of second contact protrusions 253*c*.

Figure 6:
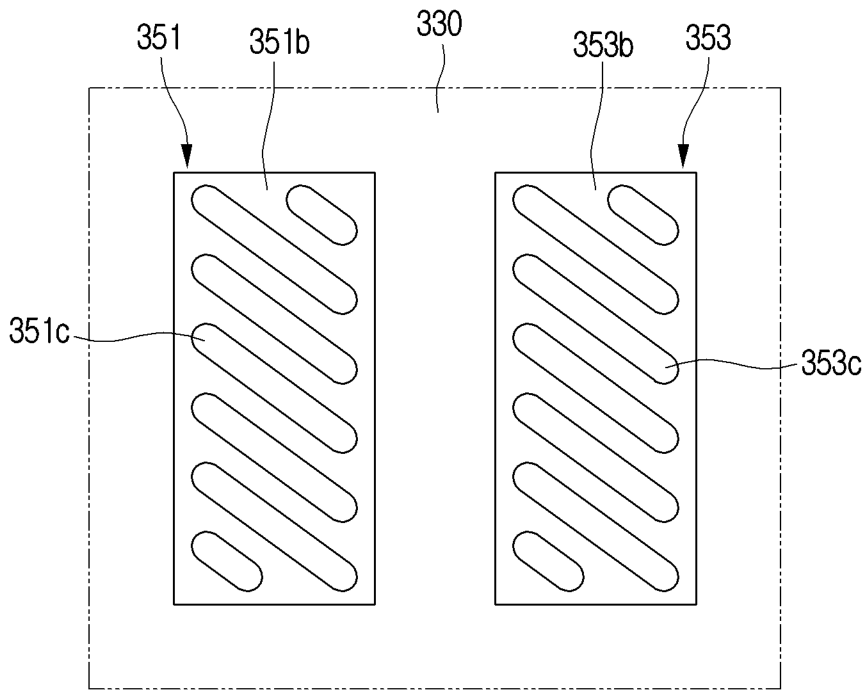
FIG. 6 is an enlarged view illustrating an example of a plurality of contact protrusions arranged in a linear form and in a hatch pattern according to one or more embodiments.

FIG. 6 is an enlarged view illustrating an example of a plurality of contact protrusions arranged in a linear form and in a hatch pattern.

Referring to FIG. 6, a first electrode member 351 disposed at a probe substrate 330 may include a plurality of elastic cores having a predetermined length and one first conductive pad 351*b* covering the plurality of elastic cores.

The plurality of elastic cores may be arranged in the hatch pattern. That is, the plurality of elastic cores may be respectively in a linear form and arranged to be inclined at an angle with respect to a length direction of the first conductive pad 351*b*, and arranged to be in parallel with one another. In this case, the plurality of elastic cores may be formed such that the lengths of the elastic cores positioned at an upper most side and a lower most side are shorter than the lengths of the remaining elastic cores.

Accordingly, a plurality of first contact protrusions 351*c* provided at the first electrode member 351 may be formed in the same shape and pattern as the plurality of elastic cores. For example, the plurality of first contact protrusions 351*c* may form the hatch pattern.

Meanwhile, the plurality of first contact protrusions 351*c* may be arranged at intervals as in FIG. 6, but is not limited thereto, and may be arranged at irregular intervals.

A second electrode member 353 disposed at the probe substrate 330 may be formed substantially the same as the configuration of the first electrode member 351. For example, the second electrode member 353 may include a plurality of elastic cores in a linear form, one second conductive pad 353*b* covering the plurality of elastic cores, and a plurality of second contact protrusions 353*c*. The plurality of second contact protrusions 353*c* may form the hatch pattern.

The electroluminescence inspection apparatus 10 according to one or more embodiments may include a driving circuit 80 configured to apply current to a plurality of light emitting diodes 70 (referring to FIG. 10), a detector 90 configured to detect light L emitting from the plurality of light emitting diodes 70 (referring to FIG. 10), and a controller 100 configured to determine separate electrical properties of the plurality of light emitting diodes 70 and a defect in a portion of the chip electrode pad based on light detected from the detector 90.

An example of carrying out the electroluminescence inspection on the plurality of light emitting diodes of the substrate subject to inspection with the electroluminescence inspection apparatus according to one or more embodiments will be described below with reference to FIG. 7 to FIG. 12.

Figure 7:
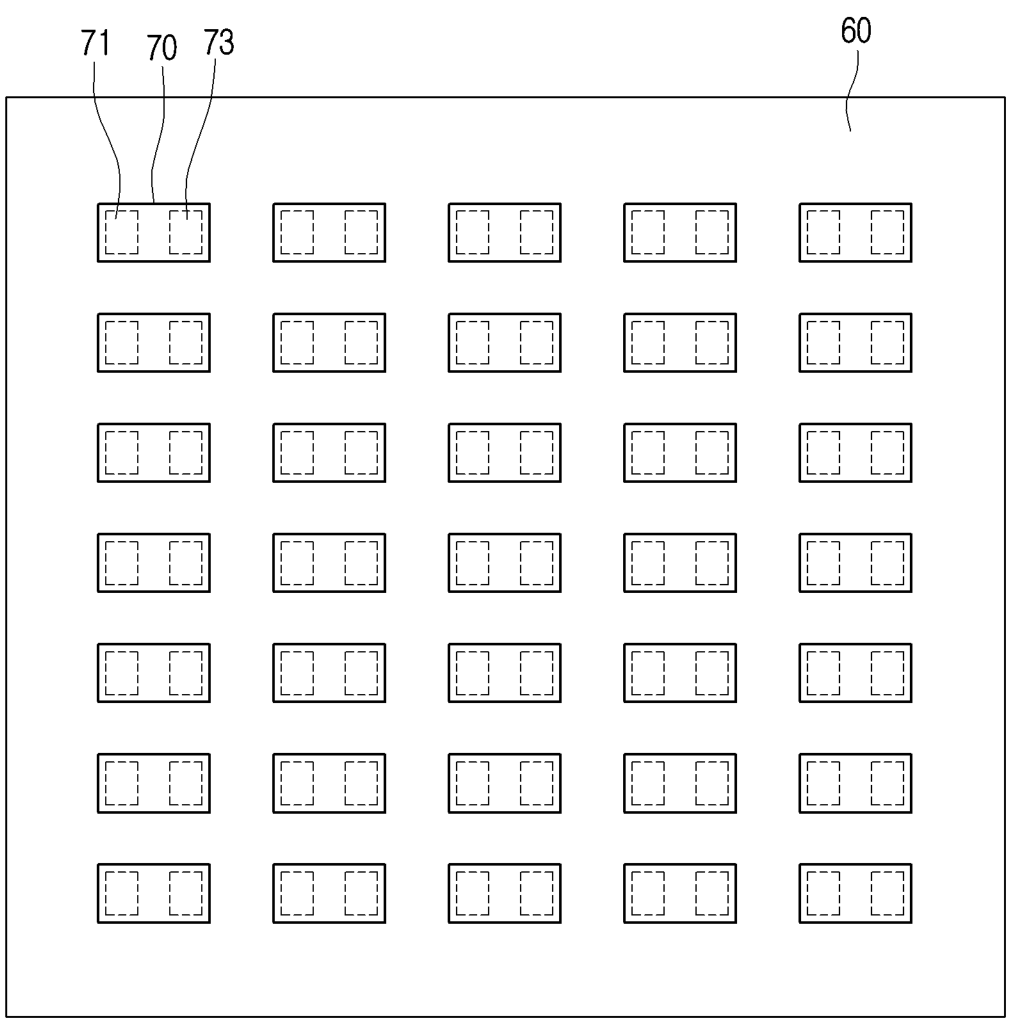
FIG. 7 is a plane view illustrating a substrate subject to inspection arranged with a plurality of light emitting diodes according to one or more embodiments.

FIG. 7 is a plane view illustrating a substrate subject to inspection arranged with a plurality of light emitting diodes.

Referring to FIG. 7, the plurality of light emitting diodes may be grid arranged at a pitch at a back surface of the substrate subject to inspection 60.

The plurality of light emitting diodes may self-illuminate based on current being applied to inorganic light emitting diodes having a size of less than or equal to 100 μm. For example, the plurality of light emitting diodes may be micro LEDs.

The substrate subject to inspection 60 may be formed of a glass substrate such that light emitted from the plurality of light emitting diodes 70 is transmitted based on performing the electroluminescence inspection.

The substrate subject to inspection 60 may be an epi substrate on which the plurality of light emitting diodes 70 are grown.

Alternatively, the substrate subject to inspection 60 may be a relay substrate on which the plurality of light emitting diodes 70 transferred from the epi substrate are arranged at a pitch. In this case, an adhesive layer to which the plurality of light emitting diodes 70 can be attached may be formed at an opposite surface of the relay substrate. The plurality of light emitting diodes 70 may be configured such that a light emitting surface is attached to an opposite surface of the substrate subject to inspection 60 by the adhesive layer.

The light emitted from the light emitting surface of the plurality of light emitting diodes 70 may be transmitted through the substrate subject to inspection 60 based on performing the electroluminescence inspection. In this case, the detector 90 disposed at an upper side of the substrate subject to inspection 60 with a predetermined interval therebetween (referring to FIG. 10) may detect light L being emitted from the light emitting surface of the plurality of light emitting diodes 70.

The light emitting surface of the plurality of light emitting diodes 70 may be an opposite surface of the surface at which the first chip electrode pad 71 and the second chip electrode pad 73 are disposed. The plurality of light emitting diodes 70 may be a flip chip type.

Figure 8:
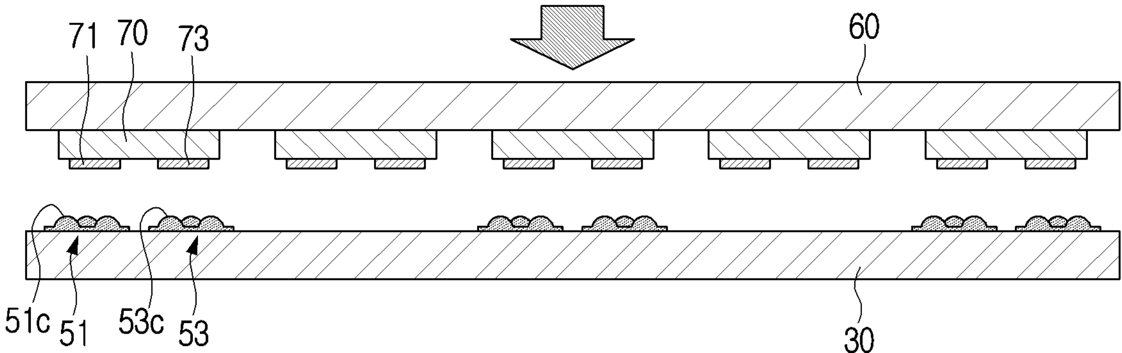
FIG. 8 is a diagram illustrating an example in which a substrate subject to inspection is moved toward an electroluminescence inspection apparatus according to one or more embodiments.

FIG. 8 is a diagram illustrating an example in which a substrate subject to inspection is moved toward an electroluminescence inspection apparatus according to one or more embodiments.

Referring to FIG. 8, the probe substrate 30 may move to an inspection position loaded on a first stage which is movable in 3 axes (a X-axis, a Y-axis, and a Z-axis). In addition, the first stage may be tilted at a predetermined angle based on the 3 axes (the X-axis, the Y-axis, and the Z-axis).

The substrate subject to inspection 60 may move to an inspection position loaded on a second stage which is movable in 3 axes (the X-axis, the Y-axis, and the Z-axis). In addition, the first stage may be tilted at a predetermined angle based on the 3 axes (the X-axis, the Y-axis, and the Z-axis).

The substrate subject to inspection 60 may be disposed at an upper side of the probe substrate 30 by the second stage. The probe substrate 30 and the substrate subject to inspection 60 may be mutually aligned by the driving of the first stage and/or the second stage.

Accordingly, the probe substrate 30 and the substrate subject to inspection 60 may be disposed parallel to each other, and the first and second chip electrode pads 71 and 73 of the light emitting diode 70 of the substrate subject to inspection 60 may be disposed to correspond respectively to the first and second electrode members 51 and 53 of the probe substrate 30 along the Z-axis direction.

The second stage may lower the substrate subject to inspection 60 in the Z-axis direction while the probe substrate 30 and the substrate subject to inspection 60 are in an aligned state.

FIG. 9 is a diagram illustrating an example in which light emitting diodes of a relay substrate are electrically contacted with electrode members of an electroluminescence inspection apparatus according to one or more embodiments.

Referring to FIG. 9, the first and second chip electrode pads 71 and 73 of the plurality of light emitting diodes 70 may be contacted at the corresponding plurality of first and second electrode members 51 and 53 of the probe substrate 30.

After contacting the first and second chip electrode pads 71 and 73 of the plurality of light emitting diodes 70 to the plurality of first and second electrode members 51 and 53 of the probe substrate 30, the substrate subject to inspection 60 may be continuously lowered along the Z-axis direction until a predetermined position.

Accordingly, the plurality of first and second electrode members 51 and 53 of the probe substrate 30 may be pressed by the first and second chip electrode pads 71 and 73 of the plurality of light emitting diodes 70.

Figure 11:
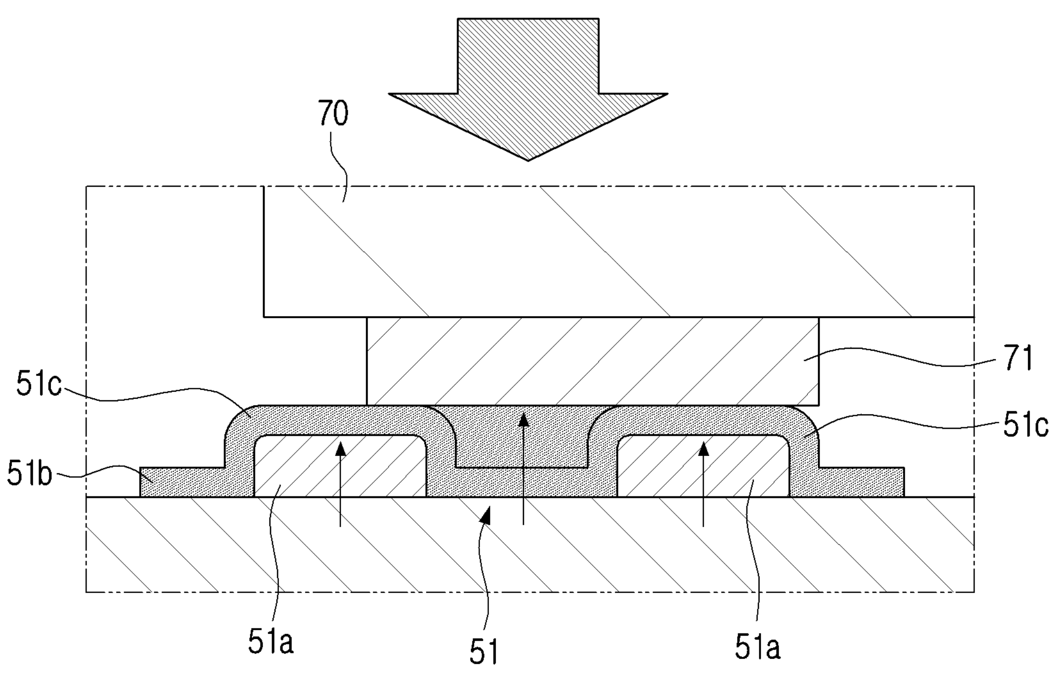
FIG. 11 is a diagram showing a plurality of elastic cores being in an elastically compressed state by being pressed by a substrate subject to inspection illustrating part C shown in FIG. 10 according to one or more embodiments.

At this time, the plurality of first contact protrusions 51*c* of the first electrode member 51 may be configured such that at least a portion is elastically contacted at the first chip electrode pad 71 of the light emitting diode 70 by being pressed by the corresponding first chip electrode pad 71 of the light emitting diode 70 (referring to FIG. 11). In this case, because the first chip electrode pad 71 of the light emitting diode 70 is densely arranged, the first chip electrode pad 71 may be contacted with at least one of the plurality of first contact protrusions 51*c* even if a misalignment between the substrate subject to inspection 60 and the probe substrate 30 occurs. Accordingly, an electrical connection between the first chip electrode pad 71 and the first electrode member 51 may be stably formed.

Likewise, the plurality of second contact protrusions 53*c* of the second electrode member 53 may be configured such that at least a portion is elastically contacted at the second chip electrode pad 73 of the light emitting diode 70 by being pressed by the corresponding second chip electrode pad 73 of the light emitting diode 70. In this case, because the second chip electrode pad 73 of the light emitting diode 70 is densely arranged, the second chip electrode pad 73 may be contacted with at least one of the plurality of second contact protrusions 53*c* even if a misalignment between the substrate subject to inspection 60 and the probe substrate 30 occurs. Accordingly, an electrical connection between the second chip electrode pad 73 and the second electrode member 53 may be stably formed.

Figure 10:
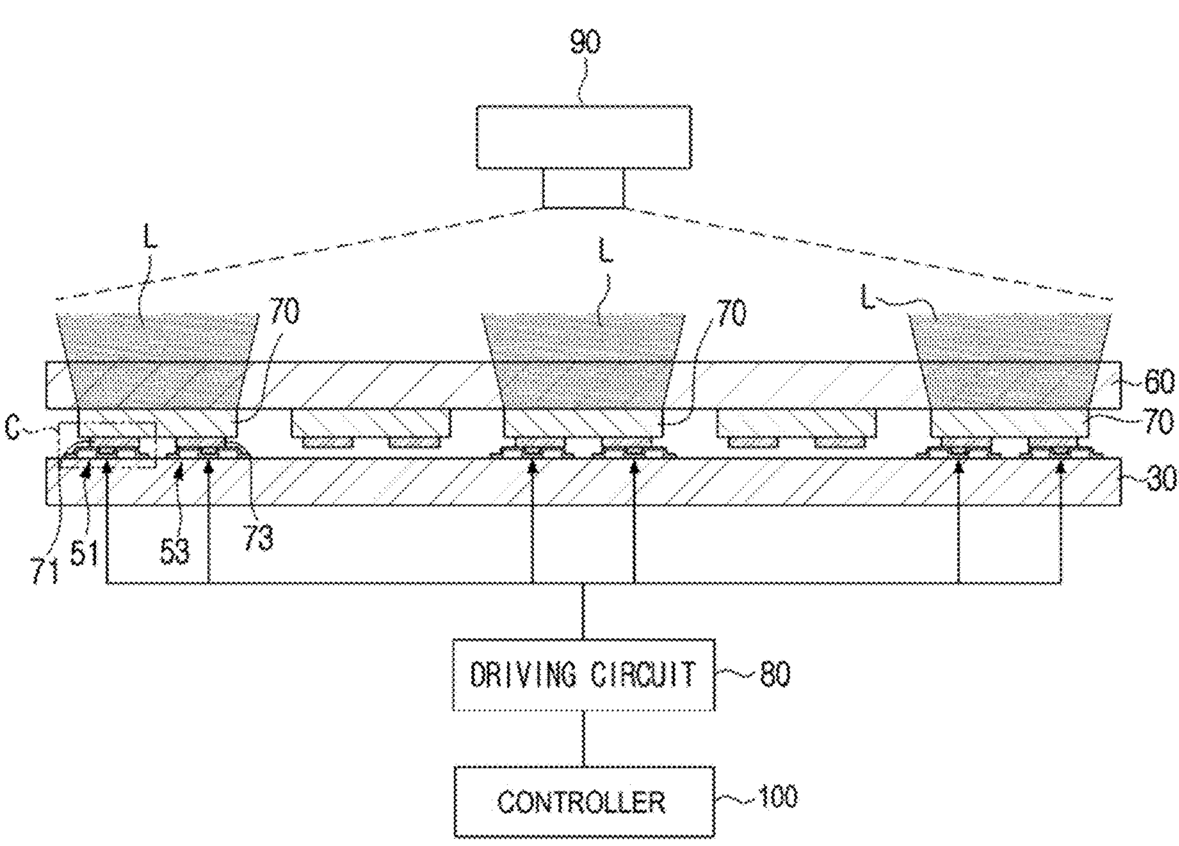
FIG. 10 is a diagram illustrating an example of carrying out an electroluminescence inspection while an electroluminescence inspection apparatus is pressed to a relay substrate according to one or more embodiments.

FIG. 10 is a diagram illustrating an example of carrying out an electroluminescence inspection while an electroluminescence inspection apparatus is pressed to a relay substrate according to one or more embodiments, and FIG. 11 is a diagram showing a plurality of elastic cores being in an elastically compressed state by being pressed by a substrate subject to inspection illustrating part C shown in FIG. 10.

Referring to FIG. 10 and FIG. 11, current may be applied to the plurality of first and second electrode members 51 and 53 through the driving circuit 80 while the first and second chip electrode pads 71 and 73 of the plurality of light emitting diodes 70 are electrically connected to the corresponding first and second electrode members 51 and 53, respectively.

The driving circuit 80 may be provided on a printed circuit board provided separately from the probe substrate 30. In this case, the driving circuit 80 may be electrically connected with the probe substrate 30.

Alternatively, the driving circuit 80 may be integrally formed with the probe substrate 30. For example, the driving circuit 80 may be provided at an opposite surface of the probe substrate 30.

The plurality of light emitting diodes 70 may emit light by receiving current through the first and second electrode members 51 and 53.

The detector 90 may detect light which is emitted from the plurality of light emitting diodes 70 and transmitted through the substrate subject to inspection 60.

The controller 100 may determine the properties of the plurality of light emitting diodes 70 and whether the plurality of light emitting diodes 70 are lit up based on the light detected from the detector 90.

Figure 12:
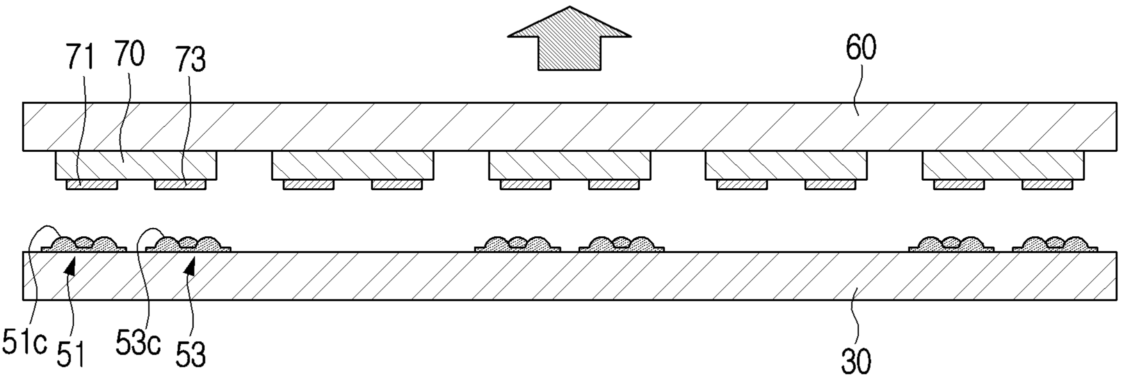
FIG. 12 is a diagram illustrating an example of separating an electroluminescence inspection apparatus from a substrate subject to inspection according to one or more embodiments.

FIG. 12 is a diagram illustrating an example of separating an electroluminescence inspection apparatus from a substrate subject to inspection according to one or more embodiments.

Referring to FIG. 12, based on the electroluminescence inspect being completed, the substrate subject to inspection 60 may be separated from the probe substrate 30 by being moved upward in the Z-axis direction. Accordingly, the pressured applied to the first electrode member 51 and the second electrode member 53 may be released.

In this case, the plurality of first elastic cores 51*a* and the plurality of second elastic cores may be restored by an elastic force. Accordingly, the plurality of first contact protrusions 51*c* and the plurality of second contact protrusions 53*c* may be restored to the dome shape. Accordingly, the electroluminescence inspection apparatus 10 according to one or more embodiments may be used repeatedly.

In addition, the electroluminescence inspection apparatus 10 according to one or more embodiments may not simultaneously emit light of all light emitting diodes arranged at the substrate subject to inspection 60, and emit light on a pitch basis (referring to FIG. 9). When inspection of a portion of the plurality of light emitting diodes of the substrate subject to inspection 60 is completed, remaining plurality of light emitting diodes of the substrate subject to inspection 60 may be inspected by moving the probe substrate 30 or the substrate subject to inspection 60.

While example embodiments of the disclosure have been illustrated and described above, it will be understood that the disclosure is intended to be illustrative, and not limiting. It will be understood by those skilled in the art that various changes in form and details may be made therein without departing from the true spirit and full scope of the disclosure, including the appended claims and their equivalents.

What is claimed is:

1. An electroluminescence inspection apparatus, comprising:
- a first substrate; and
- a plurality of electrode members arranged at a first surface of the first substrate, and electrically contacted respectively with a chip electrode pad of a plurality of light emitting diodes arranged at a second substrate based on performing an electroluminescence inspection,
- wherein one electrode member of the plurality of electrode members comprises a plurality of contact protrusions configured to be elastically contacted at a chip electrode member of a light emitting diode of the plurality of light emitting diodes based on the first substrate being pressed by the second substrate, and
- wherein the first substrate comprises:
  - a plurality of first wirings disposed on a front surface of the first substrate, wherein the plurality of first wirings are respectively connected to the plurality of electrode members;
  - a plurality of second wirings disposed on a rear surface of the first substrate; and
  - a plurality of vias or a plurality of side wirings electrically connecting the plurality of first wirings and the plurality of second wirings to each other.

2. The electroluminescence inspection apparatus of claim 1, wherein the one electrode member further comprises:
- a plurality of elastic cores protruded at the first surface of the first substrate with an interval therebetween; and
- a conductive pad comprising a first portion disposed on the first surface of the first substrate and a second portion covering the plurality of elastic cores.

3. The electroluminescence inspection apparatus of claim 2, wherein the plurality of elastic cores are formed of a polymer having elasticity.

4. The electroluminescence inspection apparatus of claim 2, wherein the conductive pad is formed of a metal having conductivity.

5. The electroluminescence inspection apparatus of claim 4, wherein the first portion of the conductive pad is electrically connected with a first wiring of the plurality of first wirings.

6. The electroluminescence inspection apparatus of claim 4, wherein the first portion of the conductive pad is electrically connected with a via formed at the first substrate.

7. The electroluminescence inspection apparatus of claim 1, wherein the plurality of contact protrusions have a same shape.

8. The electroluminescence inspection apparatus of claim 1, wherein the plurality of contact protrusions are configured such that:
- a first plurality of the plurality of contact protrusions have a first shape; and
- a second plurality of the plurality of contact protrusions have a second shape that is different from the first shape of the first plurality of the plurality of contact protrusions.

9. The electroluminescence inspection apparatus of claim 1, wherein the plurality of contact protrusions are formed in a circular form.

10. The electroluminescence inspection apparatus of claim 9, wherein the plurality of contact protrusions are configured such that a cross-section of a contact protrusion of the plurality of contact protrusions is in a dome shape.

11. The electroluminescence inspection apparatus of claim 1, wherein the plurality of contact protrusions are formed in an elliptical form.

12. The electroluminescence inspection apparatus of claim 1, wherein the plurality of contact protrusions are formed in a linear form.

13. The electroluminescence inspection apparatus of claim 12, wherein the plurality of contact protrusions are arranged in parallel along a length direction of the one electrode member with an interval therebetween.

14. The electroluminescence inspection apparatus of claim 12, wherein the plurality of contact protrusions form an inclined hatch pattern with respect to a length direction of the one electrode member.

15. The electroluminescence inspection apparatus of claim 1, further comprising:

a driving circuit configured to apply current to the plurality of light emitting diodes through the plurality of electrode members;

a detector configured to detect light emitted from the plurality of light emitting diodes; and a controller configured to identify a defect in a portion of the chip electrode pad of the plurality of light emitting diodes based on illumination of the plurality of light emitting diodes that is detected from the detector.

16. An electroluminescence inspection apparatus, comprising:

a first substrate;

a first electrode member arranged at a first surface of the first substrate configured to electrically contact a first chip electrode pad of a light emitting diode of a second substrate; and a second electrode member disposed at the first surface of the first substrate adjacent to the first electrode member configured to electrically contact a second chip electrode pad of the light emitting diode of the second substrate, wherein the first electrode member and the second electrode member are provided with a plurality of contact protrusions configured to elastically change by the first chip electrode pad and the second chip electrode pad based on pressing the first substrate to the second substrate, wherein the plurality of contact protrusions are configured to restore to a prior form by elastic force based on separating the second substrate from the first substrate, and wherein the first substrate comprises:

a plurality of first wirings disposed on a front surface of the first substrate, wherein respective first wirings among the plurality of first wirings are respectively connected to the first electrode member and the second electrode member;

a plurality of second wirings disposed on a rear surface of the first substrate; and a plurality of vias or a plurality of side wirings electrically connecting the plurality of first wirings and the plurality of second wirings to each other.

17. The electroluminescence inspection apparatus of claim 16, wherein the at least one of the first electrode member and the second electrode member further comprises:

a plurality of elastic cores protruded at the first surface of the first substrate with an interval therebetween; and a conductive pad covering the plurality of elastic cores.

18. The electroluminescence inspection apparatus of claim 17, wherein the plurality of elastic cores are formed of a polymer having elasticity, and the conductive pad is formed of a metal having conductivity.

19. The electroluminescence inspection apparatus of claim 16, wherein the plurality of contact protrusions are formed in at least one of a circular form, an elliptical form, or a linear form.

20. The electroluminescence inspection apparatus of claim 16, wherein the plurality of contact protrusions are arranged at intervals between 2 and 20 μm, inclusive.

* * * * *